United States Patent
Roy et al.

(10) Patent No.: US 6,480,978 B1
(45) Date of Patent: *Nov. 12, 2002

(54) PARALLEL TESTING OF INTEGRATED CIRCUIT DEVICES USING CROSS-DUT AND WITHIN-DUT COMPARISONS

(75) Inventors: Richard S. Roy, Danville; Charles A. Miller, Fremont, both of CA (US)

(73) Assignee: FormFactor, Inc., Livermore, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 32 days.

(21) Appl. No.: 09/260,459

(22) Filed: Mar. 1, 1999

(51) Int. Cl.[7] .............................................. G01R 31/28
(52) U.S. Cl. ..................................................... 714/724
(58) Field of Search ............................... 714/718, 724, 714/729, 735, 736, 738

(56) References Cited

U.S. PATENT DOCUMENTS

| | | |
|---|---|---|
| 3,821,645 A | 6/1974 | Vinsani |
| 4,370,746 A | 1/1983 | Jones et al. |
| 4,455,654 A * | 6/1984 | Bhaskar et al. ............... 714/28 |
| 4,500,836 A | 2/1985 | Staudacher |
| 4,517,512 A | 5/1985 | Petrich et al. |
| 4,773,028 A | 9/1988 | Tallman |
| 4,942,576 A | 7/1990 | Busack et al. |
| 5,070,297 A | 12/1991 | Kwon et al. ................ 324/158 |
| 5,243,274 A * | 9/1993 | Kelsey et al. ............... 714/724 |
| 5,357,523 A * | 10/1994 | Bogholtz, Jr. et al. ...... 714/718 |
| 5,404,099 A | 4/1995 | Sahara |
| 5,442,282 A | 8/1995 | Rostoker et al. |
| 5,461,310 A | 10/1995 | Cheung et al. |
| 5,497,079 A | 3/1996 | Yamada et al. |
| 5,506,499 A * | 4/1996 | Puar ........................ 324/158.1 |
| 5,546,405 A | 8/1996 | Golla |
| 5,625,297 A | 4/1997 | Arnaudov et al. |
| 5,642,054 A | 6/1997 | Pasiecznik, Jr. |
| 5,648,661 A | 7/1997 | Rostoker et al. |
| 5,682,472 A * | 10/1997 | Brehm et al. .................. 714/25 |

(List continued on next page.)

FOREIGN PATENT DOCUMENTS

JP        06027195        5/1994

OTHER PUBLICATIONS

IBM Technical Disclosure Bulletin, (Publication No. XP–000627991), "N–UP Test Adapter", vol. 39, No. 7, pp. 243–244, Jul. 1996.

Toshiaki, Nozaki "Patent Abstracts of Japan" vol. 10, No. 278, p. 499, Sep. 20, 1986 (Publication No: 61099876, May 17, 1986.

Aigner, Mitch "Embedded At–Speed Test Probe", International Test Conference, 1997, pp. 932–937.

*Primary Examiner*—Albert Decady
*Assistant Examiner*—Joseph D. Torres
(74) *Attorney, Agent, or Firm*—Blakely, Sokoloff, Taylor & Zafman, LLP

(57) ABSTRACT

What is disclosed is a system for testing a plurality of integrated circuit devices under test (DUTs), that includes a tester having at least one set of tester input/output (I/O) lines, the tester providing data values for testing a single DUT on the set of tester I/O lines, and circuitry coupled to the set of tester I/O lines to receive the data values from the tester and to provide error values to the tester, the circuitry forwards the data values to each of the plurality of DUTs, the circuitry performs a first comparison of the values of two locations having corresponding addresses in different DUTs after reading from the locations, and in response generates the error values indicative of the first comparison. The circuitry may further perform a second comparison of the values of two different locations in the same DUT to generate further error values indicative of the second comparison.

36 Claims, 11 Drawing Sheets

U.S. PATENT DOCUMENTS

| | | | |
|---|---|---|---|
| 5,689,515 A | * 11/1997 | Panis | 714/724 |
| 5,736,850 A | 4/1998 | Legal | |
| 5,794,175 A | * 8/1998 | Conner | 702/119 |
| 5,839,100 A | 11/1998 | Wegener | |
| 5,910,895 A | * 6/1999 | Proskauer et al. | 700/121 |
| 5,923,178 A | * 7/1999 | Higgins et al. | 324/754 |
| 5,995,424 A | * 11/1999 | Lawrence et al. | 365/201 |
| 5,995,915 A | * 11/1999 | Reed et al. | 702/119 |
| 6,064,213 A | 5/2000 | Khandros et al. | |
| 6,064,948 A | * 5/2000 | West et al. | 702/119 |
| 6,087,843 A | 7/2000 | Pun et al. | |
| 6,184,048 B1 | 2/2001 | Ramon | |
| 6,184,053 B1 | 2/2001 | Eldridge et al. | |
| 6,246,250 B1 | 6/2001 | Doherty et al. | |
| 6,256,760 B1 | 7/2001 | Carron et al. | |
| 6,275,962 B1 | 8/2001 | Fuller et al. | |
| 6,330,164 B1 | 12/2001 | Khandros et al. | |

* cited by examiner

PARALLEL TESTING OF INTEGRATED CIRCUIT DEVICES USING CROSS-DUT AND WITHIN-DUT COMPARISONS

The subject matter in this application is related to material in two other U.S. patent applications of Roy and Miller, entitled DISTRIBUTED INTERFACE FOR PARALLEL TESTING OF MULTIPLE DEVICES USING A SINGLE TESTER CHANNEL, having Ser. No. 09/260,463, and EFFICIENT PARALLEL TESTING OF INTEGRATED CIRCUIT DEVICES USING A KNOWN GOOD DEVICE TO GENERATE EXPECTED RESPONSES, having Ser. No. 09/260,460, filed on the same date as this application and expressly incorporated herein by reference.

BACKGROUND INFORMATION

This invention is related to the testing of integrated circuit devices using a semiconductor tester, and more particularly to testing a number of devices in parallel using a single channel of the tester for greater efficiency and throughput.

Integrated circuit (IC) devices are an important part of almost every modern electronic or computer system. To reduce the manufacturing cost of such systems, the manufacturer expects each constituent IC device to be free of defects and to perform according to its specifications. Thus, it is not unusual to expect that every IC device is subjected to rigorous testing prior to being shipped to the system manufacturer.

It has been determined, however, that a significant portion of the total cost of producing an IC device can be attributed to its testing. That is because many modern IC devices perform complex functions, have a large number of inputs and outputs, and operate at high speeds. For instance, a 256 Mb memory device may have 16 data lines and 22 address lines. A simplistic approach to test such a device would be to write a known data value to each memory location, and then read from each location, and then compare the value read to the expected or written value to determine any errors. However, because of the large number of locations, each containing several bits, such a technique of testing each bit of each location is very time consuming. As a result, the field of test engineering has developed to create efficient techniques for detecting as many errors as possible while using the least number of test sequences.

A memory device may be tested using an automated semiconductor tester. FIG. 1 shows such a tester 108 having a number (N) of channels for parallel testing of a number of devices under test (DUTs) such as DUT 118. The tester 108 normally executes a test program and in response generates data and addresses on each channel which define a complex test sequence 106 engineered for testing the particular DUTs. Each channel of the tester 108 feeds a respective DUT so that a number of DUTs, corresponding to the number of channels, are tested simultaneously. A probe card (not shown) receiving all N channels delivers address and write data of the test sequence 106 to locations in N different DUTs simultaneously, while the DUTs are still part of a semiconductor wafer 116. The tester 108 then reads from those locations and performs a comparison with expected data it generates. The results of the comparison help determine whether a particular bit read from a location in a DUT is in error. The tester 108 performs the above read and write cycles many times with the same or different data patterns to verify as many locations of the DUTs as possible given time and budget constraints.

To increase throughput in terms of the number of DUTs tested per unit time, a larger tester may be built having more channels. Such a solution, however, could be prohibitively expensive. The tester is a complex and high speed machine, requiring much time and expense to modify or improve. Moreover, a single channel of a modern tester may comprise between 50 to 100 signal wires, such that increasing the number of channels between the tester and the probe card will make it physically impractical to connect all of the signal wires to the probe card. Therefore, a more efficient solution for increasing the throughput of an IC test system is needed.

SUMMARY

Accordingly, an embodiment of the invention is directed to interface circuitry that essentially acts as a relay between the tester and a number of DUTs, where test vectors on each channel are fanned out to multiple DUTs. In general, the test vectors include stimuli, such as addresses, data values, and control signals, that are passed on to the DUTs while maintaining any timing constraints between the stimuli that were set up by the tester. The responses by the DUTs to these stimuli may then be collected by the interface circuitry and relayed back to the tester. If desired, the interface circuitry may be further enhanced with error detection capability based on the responses. For instance, the response from each DUT may be evaluated for internal consistency, by within-DUT and across-DUT comparisons, or it may be evaluated by comparison to expected responses received from the tester. The results of the comparison may then be provided back to the tester in summary or in detail form.

In a further embodiment, a system is disclosed for testing a plurality of integrated circuit devices under test (DUTs), that includes a tester having at least one set of tester input/output (I/O) lines, the tester providing data values for testing a single DUT on the set of tester I/O lines, and circuitry coupled to the set of tester I/O lines to receive the data values from the tester and to provide error values to the tester, the circuitry forwards the data values to each of the plurality of DUTs, the circuitry performs a first comparison of the values of two locations having corresponding addresses in different DUTs after reading from the locations, and in response generates the error values indicative of the first comparison. The circuitry further performs a second comparison of the values of two different locations in the same DUT to generate further error values indicative of the second comparison.

These as well as other features and advantages of various embodiments of the invention can be better appreciated by referring to the claims, written description, and drawings below.

DETAILED DESCRIPTION

Figure 2:
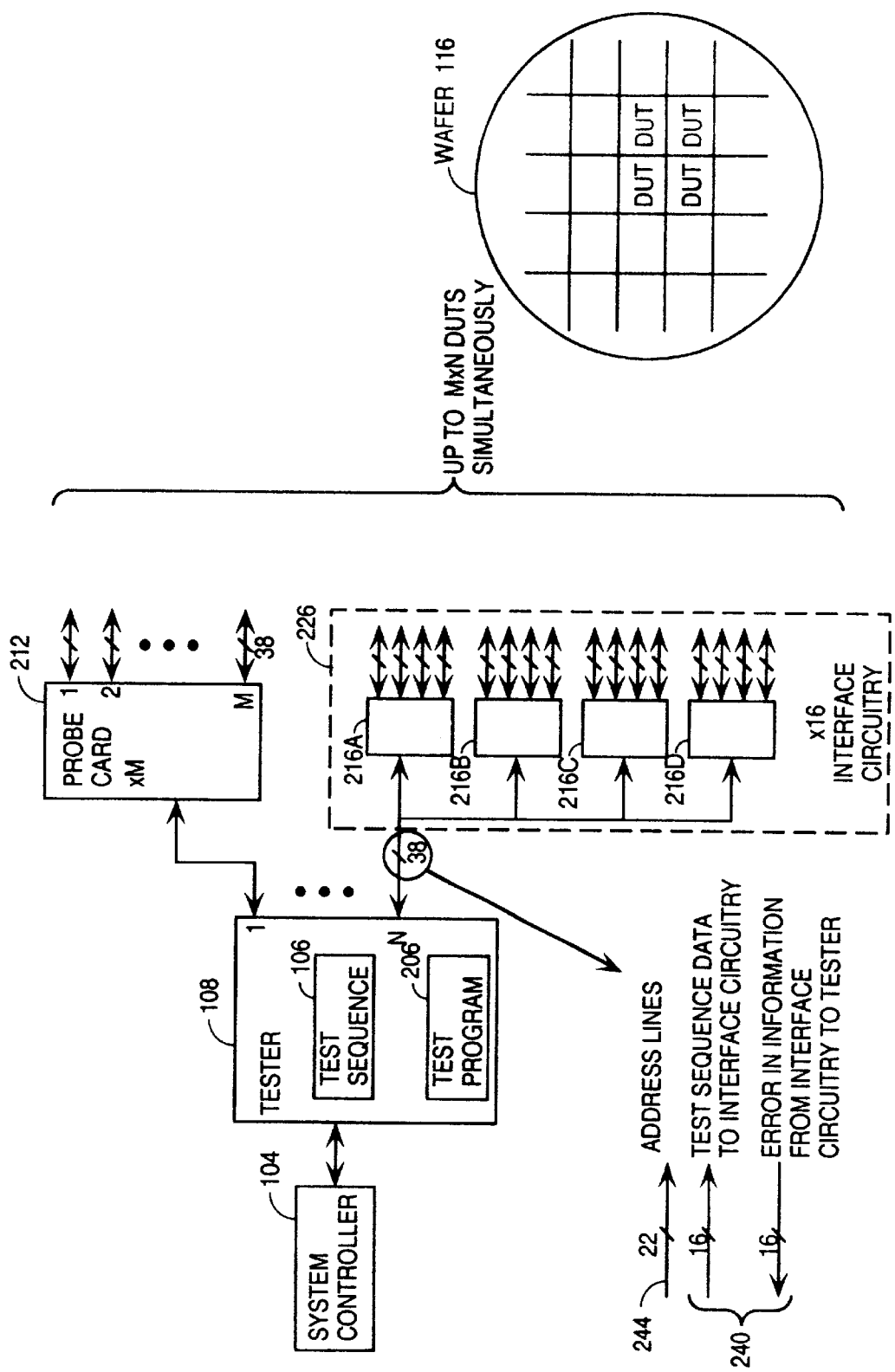
FIG. 2 shows a block diagram of a system for testing a number of DUTs simultaneously by each channel of a conventional tester, according to an embodiment of the invention.

FIG. 2 illustrates an embodiment of the invention as a system for testing multiple DUTs using a single channel of a conventional semiconductor tester. The DUT may be an entire IC die, such as a memory chip, or it may be an arbitrary semiconductor device having a memory portion. The DUTs are normally similar, and preferably identical, devices. The test system features an N channel tester 108 that operates according to a test program 206. The tester 108 may be part of an IC manufacturing and test line which features a system controller 104. The system controller 104 is responsible for orchestrating a process flow of manufacturing and test operations for the DUTs. While executing the test program 206, a test sequence 106 is followed and test vectors, including data values and associated addresses and perhaps other control signals, are provided on each channel according to conventional techniques. For instance, in the embodiment shown in FIG. 2, there are 22 address lines in address bus 244 and 16 data lines in data bus 240 (control signals not shown). Of course, one of ordinary skill in the art will recognize that other bus configurations and widths may alternatively be used, depending on the overall performance desired and the particular type of DUT being tested. The data lines are used to transport the test sequence data to interface circuitry 226. In certain versions of the invention, the same data lines may be used to return error information back to the tester 108. This complies with the conventional bi-directional use of the data lines of a tester channel.

The interface circuitry 226 for each channel is divided into subcircuits 216a, 216b, . . . Each subcircuit 216 can drive a combination of inputs and monitor a combination of outputs of one or more DUTs. Each subcircuit 216, for this particular embodiment, is configured to communicate with four DUTs simultaneously. One of ordinary skill in the art will recognize that each subcircuit can be configured to interface with fewer than or greater than four DUTs. Each subcircuit 216 forwards a test vector received from the single channel to each of four DUTs. The data value and its associated address are applied to each of the DUTs, perhaps following an address mapping, to corresponding addresses in each of the DUTs.

When the tester 108 enters a read cycle, the tester 108 provides expected data and associated addresses to each subcircuit 216. Each subcircuit 216 reads data from corresponding addresses in the DUTs. Comparisons are then performed by the subcircuit between the expected data and the read data to determine if the data read from the DUTs contains any errors. In certain cases, the subcircuit may be designed to provide the error information back to the tester 108 in real-time, such that the tester 108 can abort further testing. The tester may also collect the errors for subsequent analysis or for repair of a DUT, for example by selecting among redundant circuit elements in the DUT.

Figure 1:
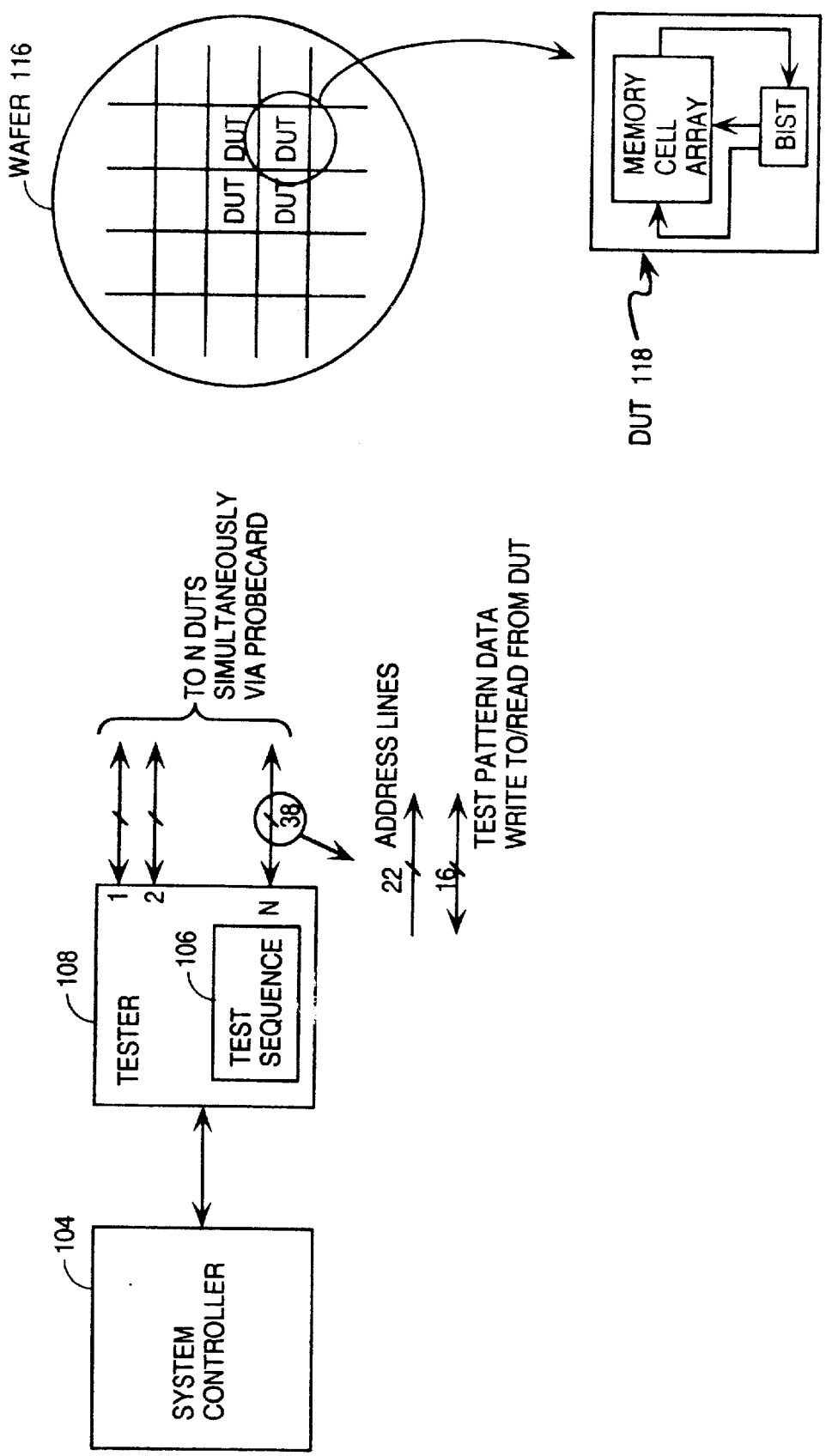
FIG. 1 illustrates a prior art system for testing IC devices, with one DUT per channel of the tester.

In a particular embodiment, the error information generated by the interface circuitry 226 is provided back to the tester 108 through the same channel that was used for receiving expected data. However, the added fan-out provided by the interface circuitry 226 restricts the number of bits that can be used to return error information simultaneously for all DUTs. For instance, when sixteen DUTs are being tested by a 16-bit (data bus) channel as shown in FIG. 1, if each DUT is assigned a channel, only 1 bit of error information can be provided per DUT. The amount of error information that is necessary to return to the tester 108 may depend on the type of testing that the process flow requires. For instance, in final test, a simple "go-no go" bit per DUT may be adequate. When testing for redundant repair, the size and configuration of the repairable circuit elements influence the bandwidth of the error information that is required.

Figure 3:
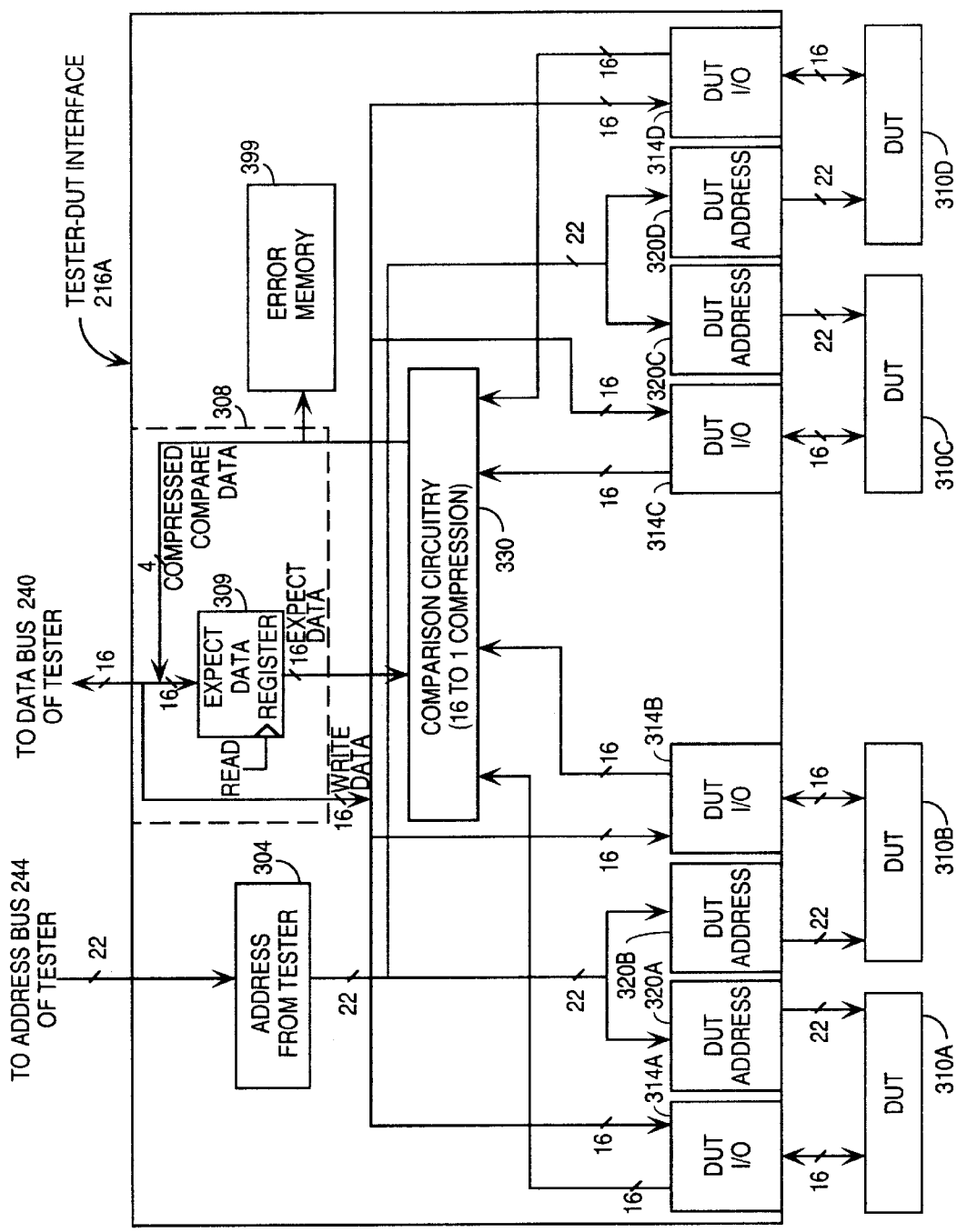
FIG. 3 illustrates a block diagram of an interface circuit according to an embodiment of the invention.

FIG. 3 shows a high level block diagram of the internal architecture of a tester DUT interface subcircuit 216a. A channel address port 304 is provided to receive addresses from the address bus 244 and control signals from a control bus (not shown) of a single channel. A tester data I/O port 308 is provided to receive data values from the data bus 240 of the single channel. An expect data register 309 is clocked by a read control signal received from the channel's control bus (not shown) to latch the expected data. In this embodiment, four of the 16 lines of the data bus are used by the subcircuit 216a to return error information back to the tester 108 regarding four DUTs, 310a, 310b, 310c, and 310d. The remaining 12 lines will be used in a similar fashion by the other subcircuits 216b, 216c, and 216d.

On the DUT side, DUT I/O ports 314a, 314b, 314c, and 314d are provided as a data interface with their corresponding DUTs. Note that the 16 data bits received through the tester I/O port 308 are copied to all four DUT I/O ports which in turn forward the data to their respective DUTs. A number of DUT address ports 320a, 320b, 320c, and 320d are provided for delivering the received address or a mapped address to each respective DUT.

Figure 4:
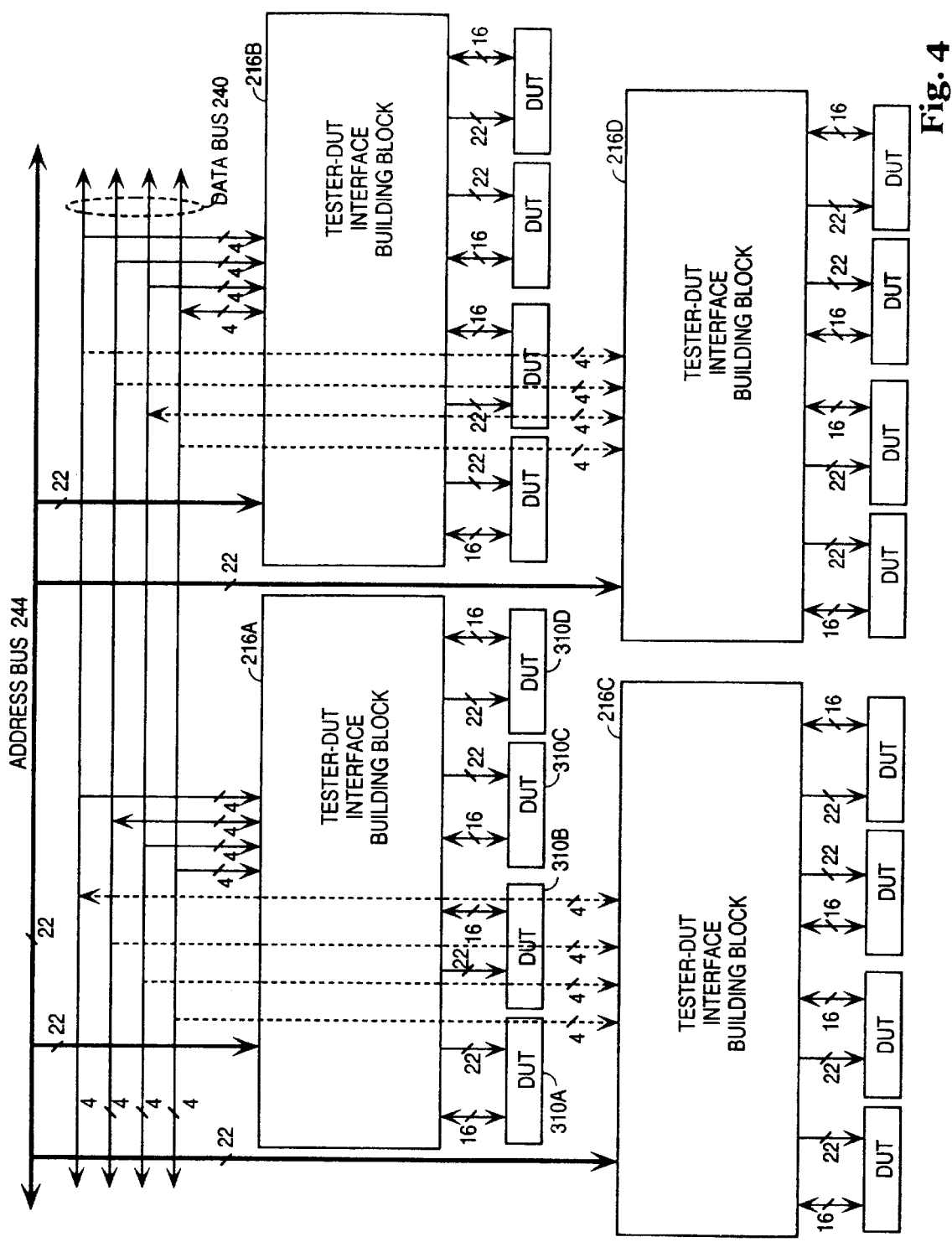
FIG. 4 shows a block diagram of channel-DUT interface circuitry for testing 16 DUTs simultaneously using a single channel of the tester, according to an embodiment of the invention.

Comparison circuitry 330 receives read data from each respective DUT and performs a comparison to determine whether the read data exhibits any errors. The results of such a comparison may then be compressed, sent back to the tester 108 or system controller 104, or stored in memory 399. In the embodiment of FIGS. 2–4, a 16:1 compression is performed by the comparison circuitry 330. This means that for every 16 bits of data at each location of a DUT, 1 error bit is generated by each subcircuit 216, such that for each address, 16 error bits in total are provided by the interface circuitry 226 on the data bus 240 of the tester channel. FIG. 4 shows the complete set of four tester-DUT interface subcircuits 216a, 216b, 216c, and 216d and how they may be coupled to the address and data buses of a single tester channel. Each subcircuit 216 provides 4 bits of error information on the data bus, for a total of 16 bits corresponding to four sets of four DUTs each. Other ways of configuring the interface circuitry 226 for testing a greater number of DUTs simultaneously, using a single channel of the tester 108, may be devised by one of ordinary skill in the art. These configurations depend on the amount of error data required by the process flow. For instance, in a final test scenario, a single fail bit might be sufficient for each DUT. In other cases, a fail bit per address/location may be sufficient. Also, rather than using the parallel bus approach shown in FIG. 4, a serial link might alternatively be used to connect the interface circuitry 226 to the tester 108 or system controller 104.

Returning briefly to FIG. 2, the interface circuitry 226 may be part of a probe card 212 which is coupled to a separate channel of the tester 108. The probe card 212 shown in FIG. 2 provides a fan-out of M, so that its channel is coupled to M different DUTs simultaneously on a wafer 116. Therefore, a system using a conventional N-channel tester 108 normally capable of testing 16 DUTs, one DUT per channel, would be capable of testing M×N DUTs simultaneously if equipped with N probe cards.

Figure 5:
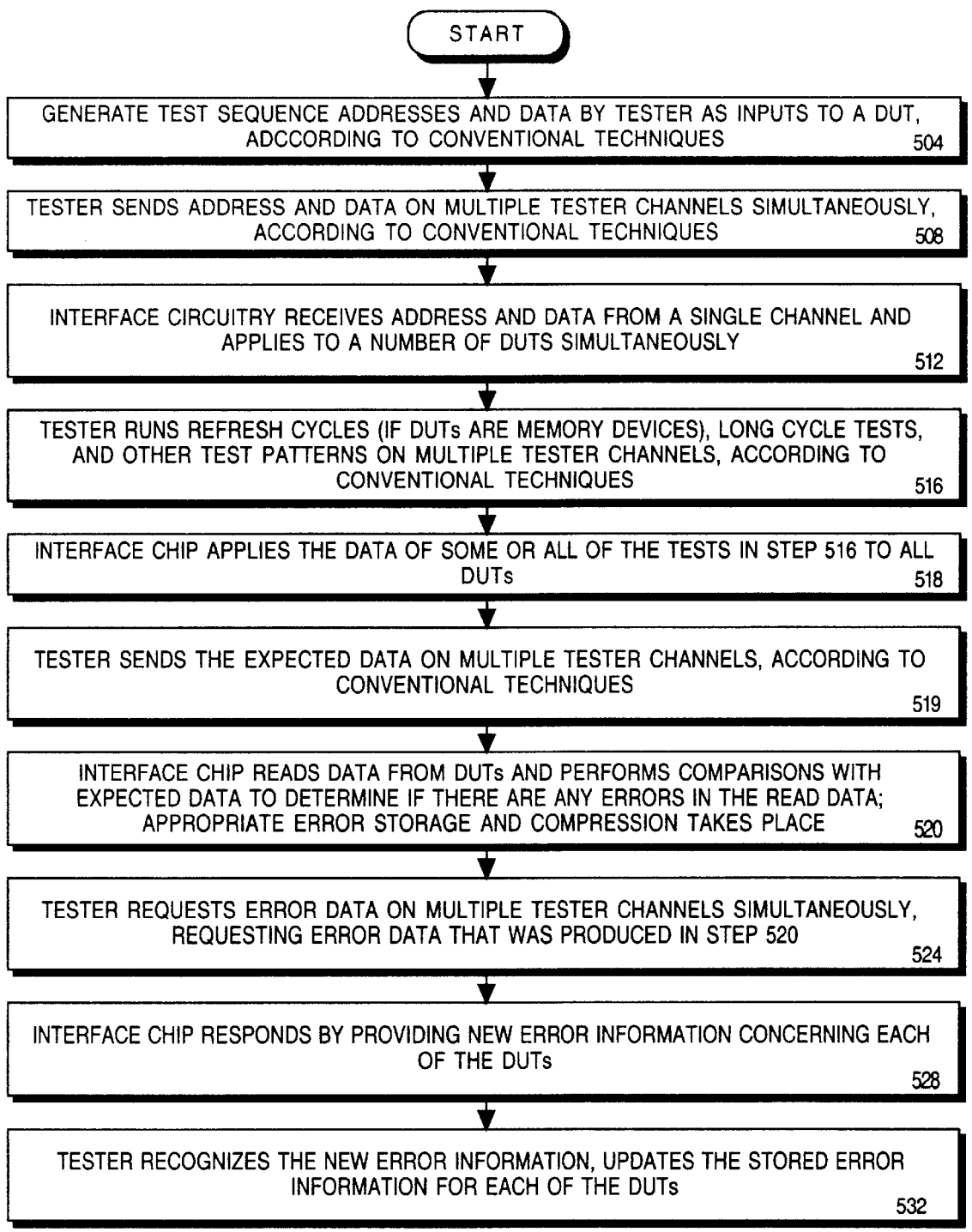
FIG. 5 is a flow diagram of operations performed in a system for testing IC devices using expected data received form the tester, according to an embodiment of the invention.

FIG. 5 illustrates a flow diagram of the operations performed in a system for testing IC devices, according to an embodiment of the invention. Operation may begin with step 504 in which the tester 108 generates addresses and data for a test sequence to be applied as inputs to a single DUT. This may be done according to conventional test engineering techniques of generating a data value and an associated address on each channel of the tester 108. Operation proceeds in step 508 where the tester sends the data and associated address on multiple tester channels simultaneously, once again according to conventional techniques. Operation then proceeds with step 512 in which the interface circuitry 226 receives the data and addresses over a single channel, and in response applies the data to a number of DUTs simultaneously. The addresses presented to each of the DUTs may be the same as the addresses received from the tester. Alternatively, an address received from the tester 108 may be mapped to different, corresponding addresses/locations in the DUTs. This mapping allows the interface circuitry 226 to be configured for single DUT operation, where the tester 108, if so programmed, can access any location in any of the DUTs, preferably after the test sequence has been completed. The added latency due to the interface circuitry 226 when forwarding the data to the DUTs (which may not have been present when each channel was handling only a single DUT) may be easily handled by inserting a systematic delay between consecutive read or consecutive write commands in the test program or in the interface circuitry 226.

After the tester 108 has delivered the address and data over the channels, operation may proceed with step 516 in which the tester 108 may optionally run refresh cycles if the DUTs are memory devices, or arbitrary semiconductor devices including memory portions. In addition, long cycle tests and other test patterns which may be designed to stress the electrical parameters of the DUTs may be delivered to the interface circuitry 226, as in step 512. The interface circuitry 226 will normally be configured to mimic such sequences to all of the DUTs. Operation then proceeds with step 519 in which the tester sends an expected data value to the interface circuitry 226, while simultaneously initiating a read from each DUT. The expected data value and its associated address are normally the same as the data and address that were sent by the tester in step 508. Operation then proceeds with step 520 where the interface circuitry 226 latches the expected data from the channel, reads data from corresponding locations in the DUTs, and performs comparisons between the read data and the expected data to determine if there are any errors in the read data.

The results of such a comparison may then be compressed, sent back to the tester 108 or system controller 104, or stored in memory 399 (see FIG. 3). The error information may be returned to the tester either in real-time or as a post process, using the same channel over which the expected data arrived. The compression depends on the number of DUTs being tested by each channel and the width of the data bus in the channel. For instance, when sixteen DUTs are tested by each channel having a 16-bit data bus, a 16:1 compression may be performed so that 1 bit of error information is available per DUT. This, of course, means that if there is an error in 1 or more of the 16 bits at a given location read from a DUT, the exact bit location of the errors are not transmitted back to the tester in real time. If desired, the interface circuitry 226 may be configured with a bypass mode which allows the tester 108 to query any failed locations of any particular DUT to determine the exact bit locations of the error. This will typically be done following completion of the test sequence. Alternatively, the memory 399 may be used to collect the error data for post processing by the tester 108 or system controller 104.

Figure 6:
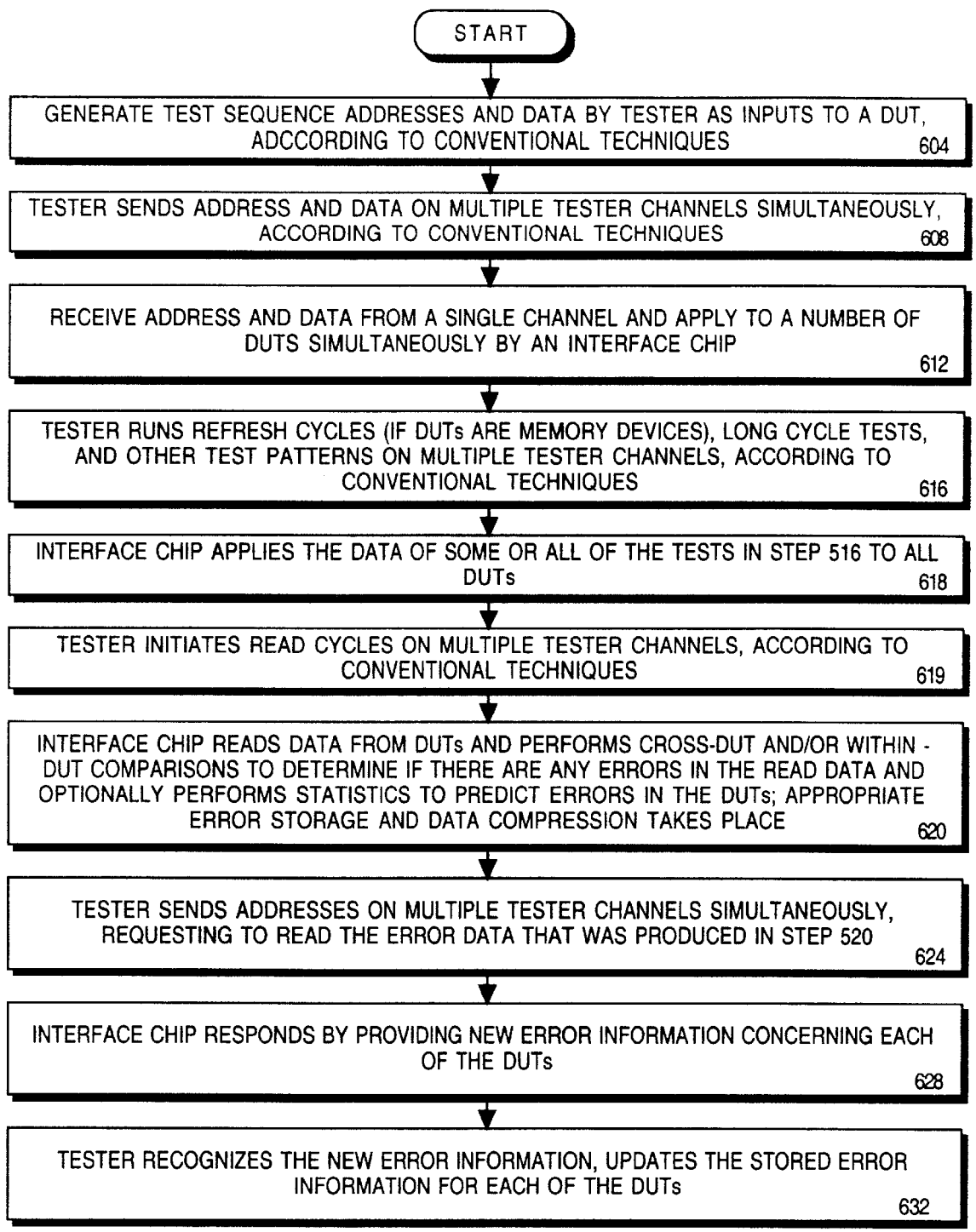
FIG. 6 is a flow diagram for testing devices without receiving expected data from the tester.

FIG. 6 is a flow diagram of an alternative technique for determining error information using the interface circuitry 226, without delivering expected data over the tester channels. The interface circuitry may be configured to operate in this and, in general, different modes in response to instructions received from the tester. See, for example, U.S. patent application Ser. No. 09/260,460 of Ray and Miller entitled EFFICIENT PARALLEL TESTING OF INTEGRATED CIRCUIT DEVICES USING A KNOWN GOOD DEVICE TO GENERATE EXPECTED RESPONSES. Operations 604–616 may be performed in the same manner as operations 504–516 in FIG. 5. Once the interface circuitry 226 has applied test data to its corresponding DUTs in step 618, operation continues with step 619 in which the tester 108 initiates a read cycle on each channel to read from the locations to which it previously wrote. The interface circuitry 226 responds in step 620 by reading from its corresponding DUTs, and performs comparisons of data values across DUTs and/or within DUTs to determine any errors in the DUTs. For instance, the interface circuitry 226 may be configured to perform comparisons of groups of bits within the same location which had the same bit pattern written to them in step 618. Such a conventional technique is discussed below in connection with FIG. 7. In addition or instead of the conventional technique, the interface circuitry 226 can be further configured to perform comparisons of corresponding locations in different DUTs. This latter technique is described below in relation to FIG. 8. A combination of these two techniques of "within word" and "across DUT" comparisons is illustrated in FIGS. 9a and 9b. Thus, in contrast to the embodiment of FIG. 5, the tester 108 in FIG. 6 does not send expected data to the interface circuitry 226 during the test sequence. Rather, the interface circuitry 226 performs cross-DUT and within-DUT comparisons, such as in FIGS. 7–9 below, and optional statistics, to predict errors in the DUTs with relatively high confidence. Appropriate storage of the error data and compression also takes place. Eliminating the cycle of sending expected data may further reduce the time needed to test the DUTs, thus promoting a more efficient testing methodology.

Regardless of which technique is used to generate the error information in step 520/620, operation continues in FIG. 5 with steps 524 and 528 (and corresponding steps 624 and 628 in FIG. 6) in which the interface circuitry 226 provides error information concerning each of the DUTs in response to a request from the tester 108 to read from particular addresses. Operation then continues with step 532/632 in which the tester 108, according to a modified test program, recognizes that the new error information relates to a number of DUTs rather than to a single DUT, and updates its stored error information for each of the DUTs accordingly. Steps 504–532 described above may be repeated many times as required by the test sequence 106 (see FIG. 1).

As mentioned above, step 520 in FIG. 5 involves performing a comparison by the comparison circuitry 330 (see FIG. 3) to determine if there are any errors in the read data obtained from the DUTs. Several techniques for performing the comparison are presented in this disclosure. One such technique that was introduced above configures the comparison circuit 330 to perform an exclusive OR (XOR) operation upon corresponding bits of an expected data value received from the tester 108 and of a read data value from a DUT.

Figure 7:
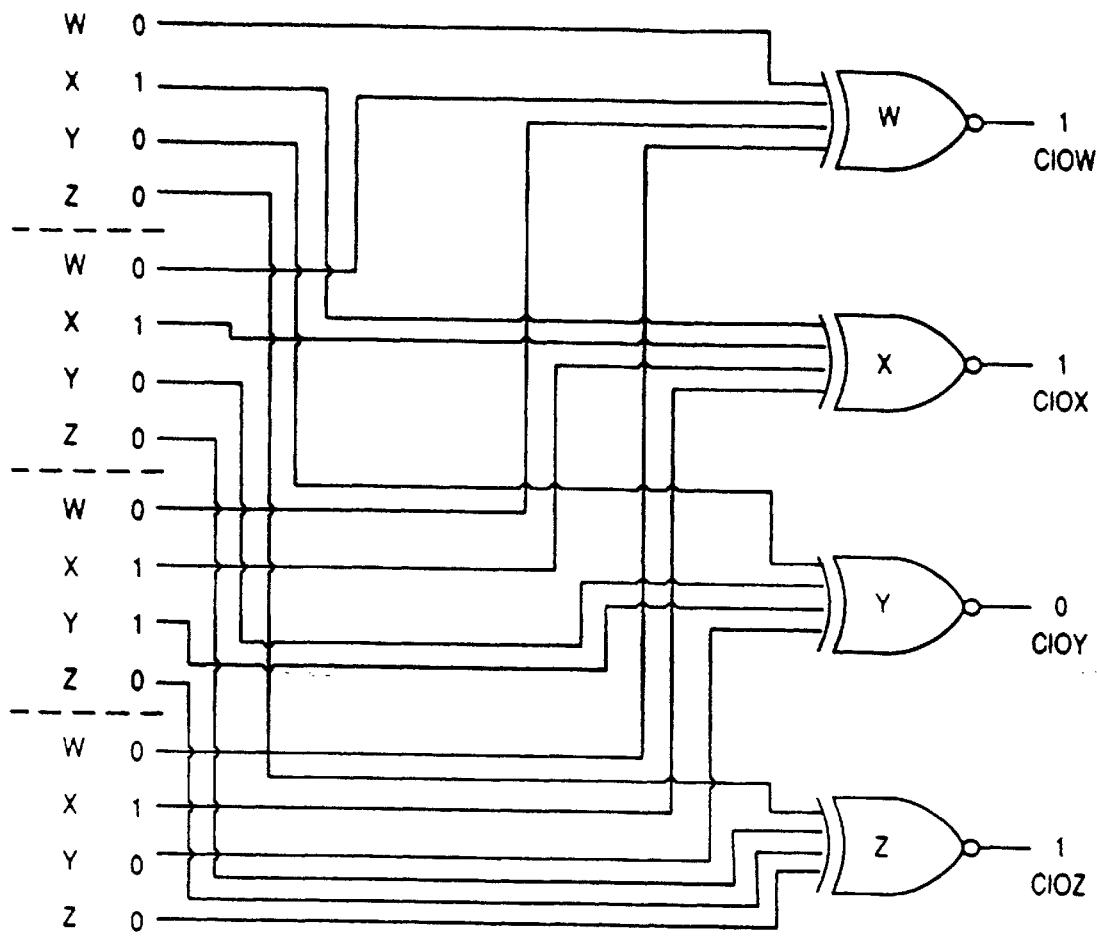
FIG. 7 shows a conventional technique for testing a 16-bit word of a memory device.

In contrast, FIG. 7 shows a conventional technique for performing a comparison within a location or data word of a DUT. The objective here is to obtain a 4-bit compressed error value that represents errors, if any, in a 16-bit word of a single DUT. Using this technique, 4 DUTs may be tested in parallel so that 16 bits of error data can be returned to the tester 108 through a 16-bit data bus of the channel. In FIG. 7, a 16-bit data word to be compared is divided into four groups of 4 bits referenced W, X, Y, and Z. In this case, it is assumed that the pattern of data that was written to this data word repeats every 4 bits such that each group should have the identical bit pattern. In the particular example of FIG. 7, CIOW, CIOX, CIOZ all indicate a positive result. This means that all of the W, X, and Z bits in the data word are correct. In contrast, CIOY indicates a negative result for bit location Y, without specifying which group contains the error in bit Y. Although this type of compressed error information provides an incomplete picture of the errors encountered in a data word, it may nonetheless be useful in certain situations where, for instance, the DUT contains redundant circuitry that can replace the circuitry which provided the failing Y bits.

One drawback of the conventional approach in FIG. 7 is that a false positive result of a comparison CIO could be generated when all corresponding bits of a given location are in error. For instance, with CIOY indicating a negative result, at most 1, 2, or 3 of the four corresponding Y bits can be in error. If all four of the Y bits were in error, however, then CIOY would indicate a positive result, because all four inputs to its XOR gate would have the same value. Although it is a rare case where all four corresponding bits are in error, it is desirable to eliminate or at least reduce the occurrence of such a false positive result. This could be accomplished by configuring the interface circuitry 226 into a bypass mode and running a conventional test using tester 108 to test a single device of the multiple devices for absolute accuracy.

Figure 8:
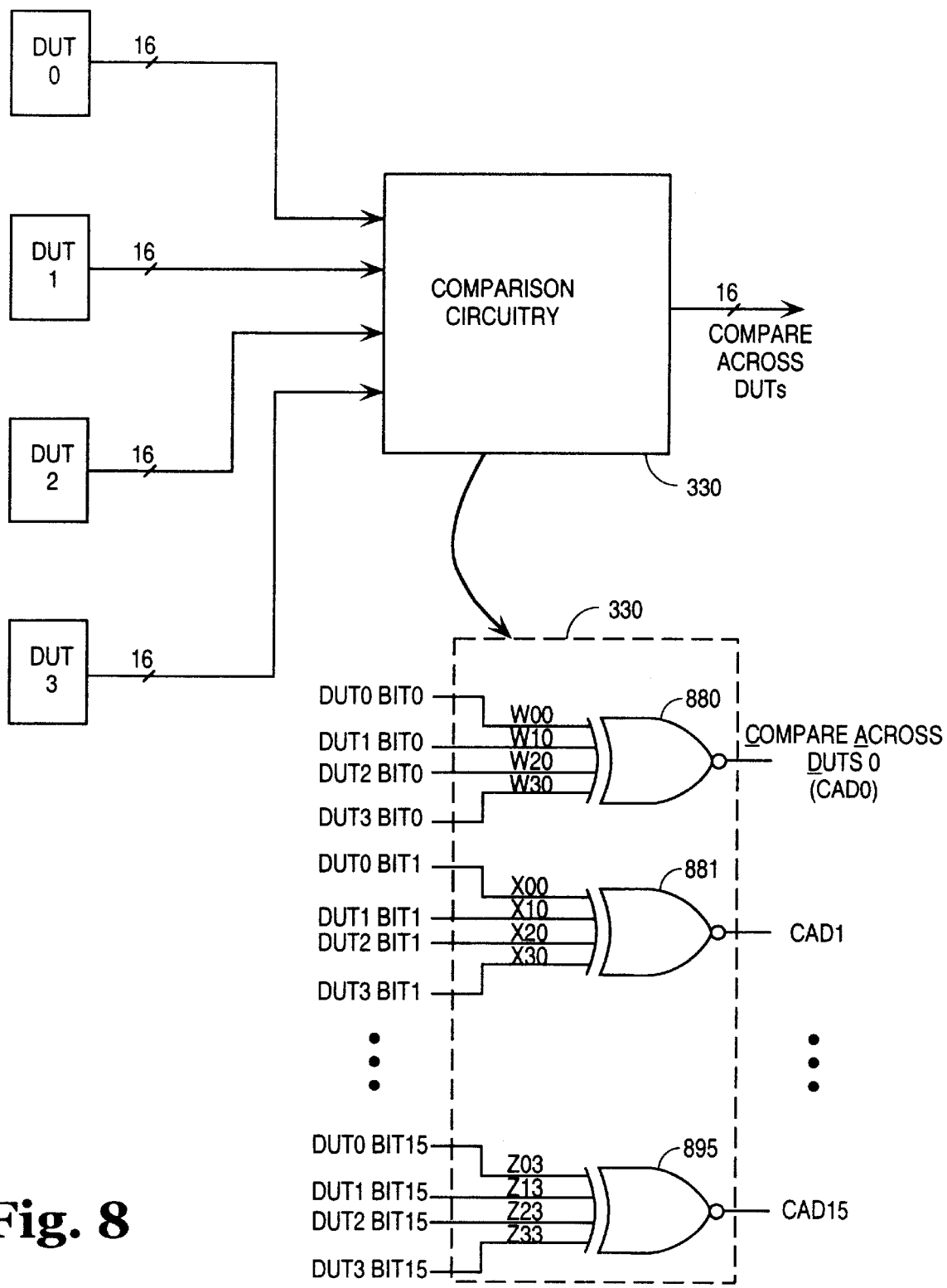
FIG. 8 shows a technique for providing error values concerning four DUTs on a channel being 16-bits wide, using comparisons made across DUTs, according to another embodiment of the invention.
Figure 9A:
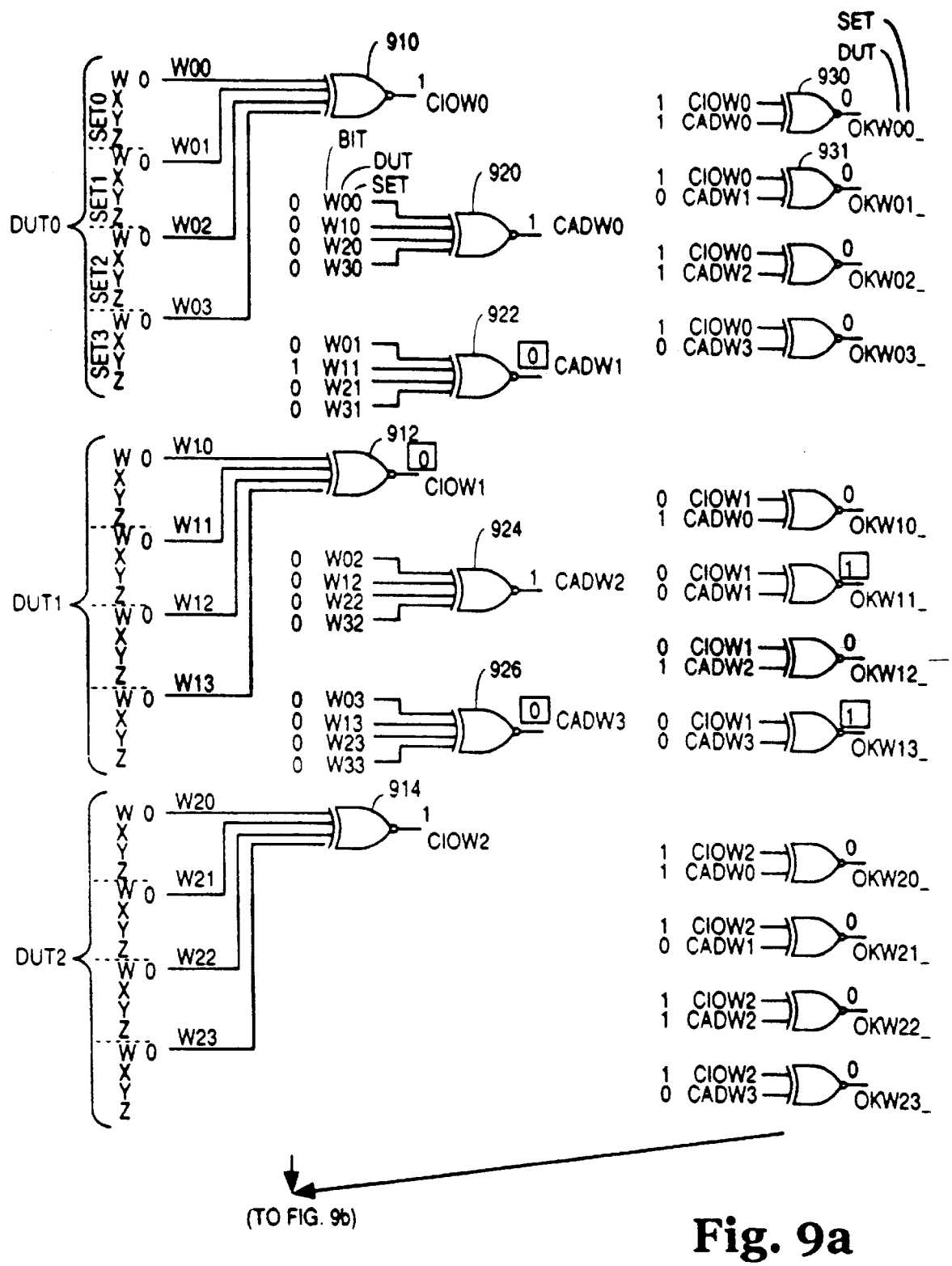
FIGS. 9a and 9b show a technique for testing four DUTs using a combination of within-word comparisons and across-DUT comparisons, according to another embodiment of the invention.
Figure 9B:
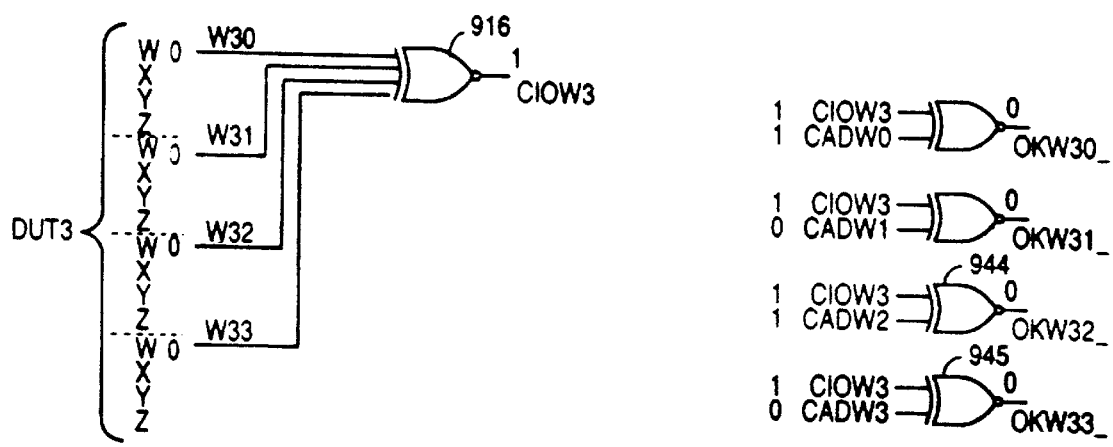

FIG. 8 illustrates another technique of performing a comparison. Such a technique involves comparing bits from different DUTs. Although FIG. 8 shows comparing across 4 DUTs, the concept may be implemented with any number of DUTs, within practical limitations, of course. Once again, this scheme assumes that the comparisons made by each XOR gate are of bit values that should be the same, such that a positive result is generated only if all bits have the same 0 or 1 value. For this example, each data word comprises 16 bits. The first XOR gate 880 provides a Compare Across DUTs of bit 0 in each of the DUTs (CAD0). Similarly, CAD1 from XOR gate 881 gives the result of comparing bit 1 in each of the DUTs and so on until CAD15 from XOR gate 895. In contrast to the repetitive pattern required for the conventional technique in FIG. 7, this approach allows an arbitrary pattern of data to be written in each word. However, the CAD result does not indicate which DUT contains the error, but only that one or more bits are in error. The CAD result will give a false positive result if 4 corresponding bits in 4 different DUTs are all in error. As mentioned previously, this situation can be avoided by testing at least one of the DUTs for absolute accuracy using the bypass mode.

FIGS. 9a and 9b illustrate a combination of within word and across DUT comparisons which increases the confidence in a positive result by several orders of magnitude over either the conventional technique of FIG. 7 or the across DUT comparison in FIG. 8. The schematic in FIGS. 9a and 9b shows the comparison circuitry for bit W which is the first of 4 bits in a group, where each data word comprises 4 such groups. Thus, the circuitry shown in FIGS. 9a and 9b will be repeated 3 times to provide the results of comparisons for bits X, Y, and Z.

The first series of XOR gates 910, 912, 914, and 916 provide the results CIOW0, CIOW1, CIOW2, and CIOW3, respectively. CIOW0 is the result of a within word comparison of bits W in a single word of DUT0. Similarly, CIOW1 is the result of a comparison of bit W in a single word of DUT1, and so on.

The second series of exclusive OR gates in FIGS. 9a and 9b are 920, 922, 924, and 926 providing CADW0, CADW1, CADW2, and CADW3, respectively. CADW0 is a comparison of bits W in set 0 of each DUT, CADW1 compares bits W in set 1 of each DUT, and so on. Thus, the CADW result is similar to the CAD result of FIG. 8 except that only 4 bits (the W bits) are compared.

Finally, the third series of gates in FIGS. 9a and 9b are 930–945, a total of 16 NOR gates each providing an OKW_result. The first 4 results OKW00_ to OKW03_ indicate errors, if any, in bits 1 of one or more of the 4 sets that define a word in DUT0. Similarly, OKW10_ to OKW13_ indicate errors in bits W of the 4 sets that define a corresponding word of DUT1, and so on. Note that the exact location of the error is given, i.e., no compression is performed, because one bit is used to indicate an error in bit W of a particular set in a data word in a given DUT. When the circuitry of FIGS. 9a and 9b is repeated for bits X, Y, and Z, a total of 16×4=64 error bits are available to exactly indicate errors in any bit of a data word, in any given DUT.

If desired to return error information concerning two or more DUTs back to the tester 108 over a single channel, compression may be performed to reduce the 16 bits of error information into 4 bits in order to efficiently use a 16-bit address bus of the channel. For instance, with only 4 bits of compressed error data for each DUT, each bit indicates an error, if any, in a corresponding 4-bit set of a 16-bit data word. As mentioned before, the tester 108 may nonetheless make valuable use of such information, for example by repairing the DUT if redundant circuitry is available in the DUT to replace a failed circuit.

Figure 10:
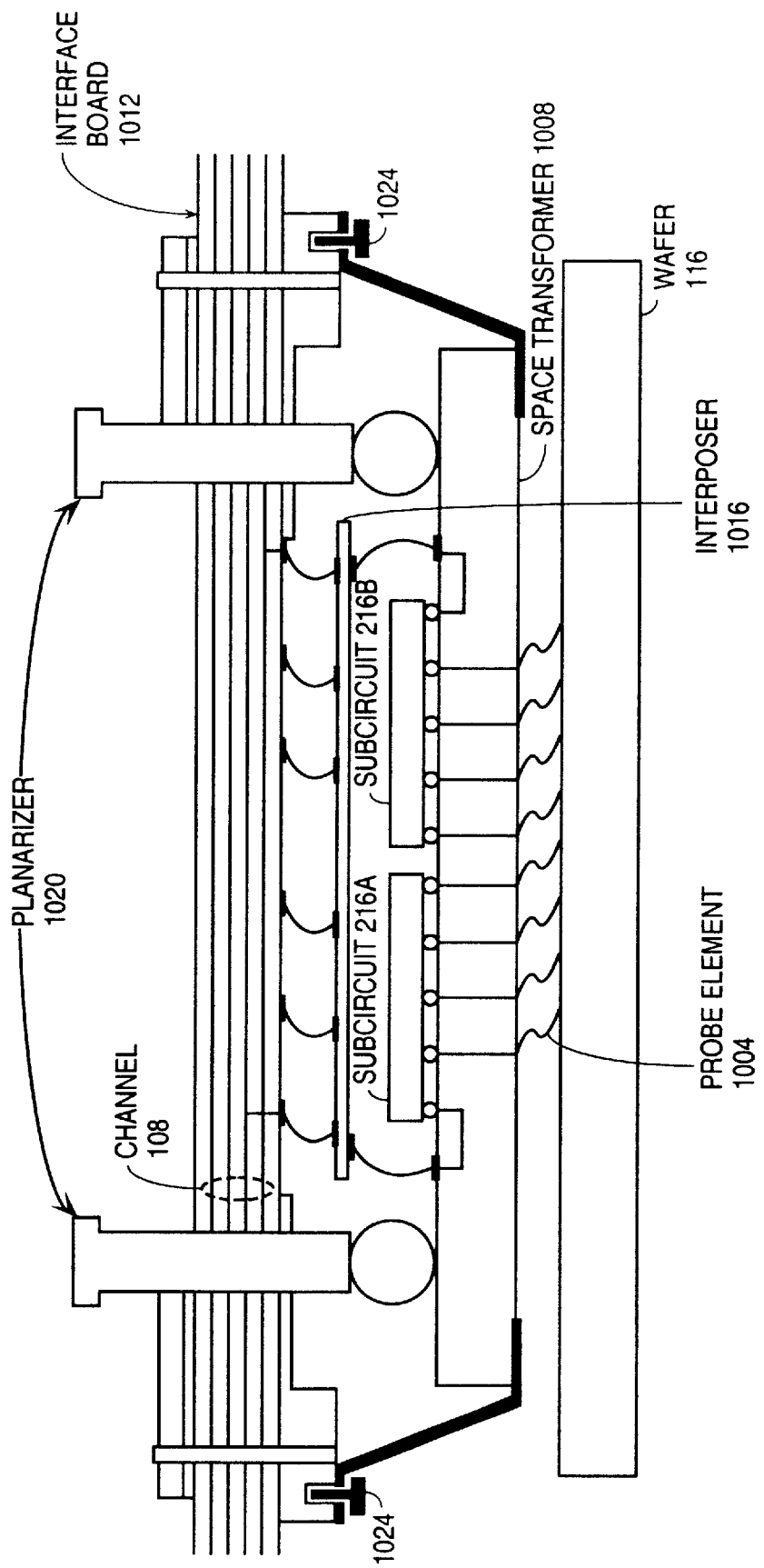
FIG. 10 illustrates a probe card according to another embodiment of the invention.

FIG. 10 illustrates a probe card 1000 comprising subcircuits 216a and 216b of the interface circuitry 226, according to another embodiment of the invention. The probe card 1000 features a number of probe elements 1004 for electrically connecting signal points of a DUT to its respective subcircuit. The probe elements 1004 are attached to a space transformer 1008 on the opposite side of which the IC die of the subcircuits are attached. Signals are transported to and from a controlled impedance tester interface board 1012 using a resilient interposer 1016. The tester channel appears as traces in the interface board 1012. The space transformer 1008 and the interface board 1012 are normally kept at a fixed relationship with each other, such as by using fasteners 1024. A planarizer 1020 may be provided to place all of the probe elements into planar alignment with the wafer 116 under test. In operation, the probe card is lowered on to the surface of the wafer for the probe elements to contact the signal points of the DUTs that form the wafer. Further details concerning this embodiment may be found in U.S. patent application Ser. No. 08/554,902, filed Nov. 9, 1995, entitled, *Probe Card Assembly With Space Transformer and Interposer* or in the corresponding PCT application published May 23, 1996 as WO96/15458.

To summarize, various embodiments of the invention for testing a number of DUTs in parallel using a single channel of a conventional tester have been disclosed. One of ordinary skill in the art will recognize that the invention is capable of use in various other combinations and environments and is capable of changes and modifications within the scope of the inventive concept expressed here. For instance, the interface circuitry described in different embodiments above would normally be implemented as one or more integrated circuit chips, each corresponding to a subcircuit, that reside on a probe card. In this way, the drive and sense electronics in the DUT ports are physically closer to the actual DUTs, thereby providing a less problematic and more cost effective electrical connection between the DUTs and the comparison circuitry. An alternative to the wafer probe card embodiment would be to place the interface circuitry upon a test fixture between the tester channel and a tray of packaged IC devices, where each DUT is part of a packaged device rather than a portion of a wafer. Accordingly, it is intended that all such modifications and/or changes be within the scope of the claims.

What is claimed is:

1. A system for testing a plurality of integrated circuit devices under test (DUTs), comprising:
   a tester having at least one set of tester input/output (I/O) lines, the tester providing data values for testing a DUT on the set of tester I/O lines; and
   circuitry coupled to the at least one set of tester I/O lines to receive said data values from the tester and to provide error values to the tester, wherein
   the circuitry forwards said data values to each of the plurality of DUTs, and
   the circuitry performs a first comparison between the values of two locations having corresponding addresses in different DUTs after reading said locations, and in response generates said error values indicative of the first comparison.

2. The system of claim 1 wherein the circuitry further performs a second comparison between the values of two different locations in the same DUT to generate further error values indicative of the second comparison.

3. The system of claim 1 wherein the DUTs are memory devices and wherein the error values represent an error, if any, in one or more bits of a location in each of the DUTs for a predefined address without specifying a specific bit of the location.

4. The system of claim 1 wherein the circuitry provides a plurality of error bits on said I/O lines, each error bit representing an error, if any, in a separate DUT.

5. The system of claim 1 further comprising:
   a probe assembly having a channel for communicating with the tester, the channel being coupled to the set of tester I/O lines, and a plurality of probe elements having one end for contacting a plurality of signal locations of the DUTs and another end connected to the circuitry, the circuitry being a part of the probe assembly and coupled to the channel.

6. A probe assembly comprising:
   a channel for communicating with a tester that provides data values for testing a DUT through the channel;
   a plurality of probe elements for contacting a plurality of signal locations of one or more devices under test (DUTs); and
   tester-DUT interface circuitry coupled between the channel and the probe elements to receive said data values from the tester and to provide error values to the tester, wherein
   the circuitry forwards said data values to each of the plurality of DUTs via said probe elements, the circuitry performs a first comparison between the values of two locations having corresponding addresses in different DUTs after reading from said locations, and in response generates error values indicative of the first comparison.

7. The probe assembly of claim 6 wherein the circuitry further performs a second comparison between the values of two different locations in the same DUT to generate further error values indicative of the second comparison.

8. An interface circuit for testing a plurality of DUTs, comprising:
   means for receiving a data value and an associated address as part of a test sequence;
   means for writing a plurality of copies of said data value at a plurality of corresponding addresses;
   means for reading from said plurality of corresponding addresses a plurality of read data values; and
   means for performing a first comparison between two of said plurality of read data values to generate an error value representing a difference, if any, between two read data values.

9. The interface circuit of claim 8 further comprising:
   means for performing a second comparison between the values of two different locations in the same DUT to generate further error values indicative of the second comparison.

10. An interface circuit for testing a plurality of DUTs, comprising:
    channel port for receiving a data value and an associate address as part of a test sequence;
    a plurality of DUT ports each for reading data values from and writing data values to a separate DUT; and
    first logic coupled to the DUT ports for performing an XOR operation upon two or more corresponding bits of two or more data values read from locations having corresponding addresses in different DUTs.

11. The interface circuit of claim 10 further comprising:
    an address mapper coupled to the channel port for generating the corresponding addresses in response to mapping the associated address.

12. The interface circuit of claim 10 further comprising:
    second logic coupled to the DUT ports for performing a plurality of second XOR operations corresponding to the plurality of DUTs, each XOR operation being performed between two or more corresponding bits of the same data value read from a location in a separate DUT.

13. The interface circuit of claim 12 further comprising:
    logic coupled to the first and second logic for generating an error value in response to performing an OR operation between the results of said first XOR operations and said second XOR operations, the error value indicating errors, if any, in a set of corresponding bits read from each of the DUTs.

14. A method for testing a plurality of DUTs, comprising:
    receiving a data value and an associated address as part of a test sequence from a single channel of a tester;
    writing a plurality of copies of said data value at a plurality of corresponding addresses in a plurality of DUTs;

reading from said plurality of corresponding addresses in said DUTs a plurality of read data values; and performing first comparisons between pairs of said plurality of read data values to generate error values representing differences between said pairs of read data values.

15. An integrated circuit test system comprising:

a tester having at least one set of tester input/output (I/O) lines, the tester to use each set to write a data value to a separate device to be tested; and a contact assembly having two or more sets of elements, each set of elements to contact a plurality of signal locations of a separate device under test (DUT), the contact assembly further includes circuitry having an input coupled to one set of said tester I/O lines and an output coupled to the two or more sets of elements to provide said data value on each set of said elements, the circuitry being further configured to read from each DUT a read data value in response to receiving a read from the tester over the set of I/O lines, compare a read data value from one DUT to a read data value from another DUT to determine an error in one or both of said DUTs, and send an error value, indicative of the error, to the tester over the set of tester I/O lines.

16. The system of claim 15 wherein the tester is configured to test the separate device as being a memory device.

17. The system of claim 15 wherein the data value is to be carried by one or more data lines of each set and the error value is to be carried by said one or more data lines that were used to carry the write data value.

18. The system of claim 17 wherein each bit of the error value is to be carried on a separate one of said one or more data lines, an error status of each DUT being represented by a separate bit of the error value.

19. The system of claim 17 wherein the contact assembly is further configured to contact each DUT as part of a packaged semiconductor integrated circuit (IC) device.

20. The system of claim 17 wherein the error value is to be carried to the tester by said one or more data lines that were used to carry the write data value.

21. The system of claim 17 wherein the circuitry is to further compare a read data value from a location in one DUT to a read data value from another location in the same DUT to determine a further error in the same DUT, and send a further error value, indicative of the further error, to the tester over the set of tester I/O lines.

22. A contact assembly comprising:

two or more sets of first elements, each set of elements is to contact a plurality of signal locations of a separate device under test (DUT); and first circuitry having an input to be coupled to one set of I/O lines of a tester and an output coupled to the two or more sets of elements, to provide a write data value, received from the tester over the set of I/O lines, on each set of said elements, the circuitry being further configured to read from each DUT a read data value, in response to receiving a read from the tester over the set of I/O lines, compare a read data value from one DUT to that from another DUT to determine an error in one or both DUTs, and send an error value, indicative of the error, to the tester over the set of tester I/O lines.

23. The contact assembly of claim 22 wherein the write data value is to be carried by one or more data lines of the set of I/O lines and the error value is to be carried by said one or more data lines that were used to carry the write data value.

24. The contact assembly of claim 23 further comprising:

two or more sets of second elements, each set of second elements to contact a plurality of signal locations of a separate device under test (DUT); and second circuitry having an input to be coupled to a further set of I/O lines of the tester and an output coupled to the two or more sets of second elements, to provide a write data value, received from the tester and carried by one or more data lines of the further set of I/O lines, on each set of said second elements, the second circuitry being further configured to read from each DUT that is contacted by the second elements a read data value, in response to receiving a read from the tester over the further set of I/O lines, compare a read data value from one DUT to a read data value from another DUT to determine an error in one or both of the DUTs that are to be contacted by the second elements, and send a second error value, indicative of the error, to the tester over the further set of I/O lines.

25. The contact assembly of claim 24 wherein the first and second circuitry are formed as separate application specific integrated circuits (ASICs).

26. The contact assembly of claim 24 wherein the second error value is to be carried by said one or more data lines in the further set of I/O lines used to carry the write data value.

27. The contact assembly of claim 24 wherein the circuitry is to further compare a read data value from a location in one DUT to a read data value from another location in the same DUT to determine a further error in the same DUT, and send a further error value, indicative of the further error, to the tester over the set of tester I/O lines.

28. An interface circuit for use when coupled between an integrated circuit tester and two or more devices under test (DUTs), comprising:

an input to be coupled to one set of I/O lines of the tester and to receive a write data value from the tester;

an output to be coupled to two or more sets of elements, where each set of elements is to contact a plurality of signal locations of a separate device under test (DUT), to provide said write data value to each set of elements; and comparison circuitry to compare a data value read from one DUT in response to receiving a read from the tester to a data value read from another DUT to determine an error in one or both DUTs, wherein the circuitry is to send an error value, indicative of the error, to the tester over the set of tester I/O lines.

29. The interface circuitry of claim 28 wherein the input is to receive the write data value via one or more data lines of the set of I/O lines and the error value is to be carried to the tester by said one or more data lines that were used to carry the write data value.

30. The interface circuitry of claim 29 wherein the circuitry is to further compare a read data value from a location in one DUT to a read data value from another location in the same DUT to determine a further error in the same DUT, and send a further error value, indicative of the further error, to the tester over the set of tester I/O lines.

31. The interface circuitry of claim 29 wherein the read data value and the error value are each no more than M bits long, the data lines of the set of I/O lines are M bits wide, and the comparison circuitry is to provide within the error value information regarding errors in locations of two or more DUTs each of which can store data values up to M bits long.

32. The interface circuitry of claim 29 wherein the error value does not indicate an exact bit location of an error in the DUTs.

33. A method for testing a plurality of devices under test (DUTs), comprising:

receiving via a set of tester I/O lines a write data value from a tester, the tester to use the set to write a data value to a single device to be tested;

providing said write data value to each of two or more sets of elements, where each set of elements is contacting a plurality of signal locations of a separate DUT;

reading a data value from each DUT in response to receiving a read from the tester;

comparing a read data value from one DUT to a read data value from another DUT to determine an error in one or both of said DUTs; and sending an error value indicative of the error to the tester over the set of tester I/O lines.

34. The method of claim 33 wherein the write data value is received via one or more data lines of the set of tester I/O lines and wherein the error value is being carried by said one or more data lines of the set of I/O lines.

35. The method of claim 34 wherein the read data value and the error value are each no more than M bits long, the data lines of the set of I/O lines are M bits wide, and the error value includes information regarding possible errors in locations of two or more DUTs each of which can store data values that are up to M bits long.

36. The method of claim 34 wherein the error value does not indicate an exact bit location of an error in the DUTs.

* * * * *